United States Patent [19]
Scorey

[11] Patent Number: 5,292,478
[45] Date of Patent: Mar. 8, 1994

[54] COPPER-MOLYBDENUM COMPOSITE STRIP

[75] Inventor: Clive Scorey, Cheshire, Conn.

[73] Assignee: Ametek, Specialty Metal Products Division, Wallingford, Conn.

[21] Appl. No.: 719,412

[22] Filed: Jun. 24, 1991

[51] Int. Cl.$^5$ .............................. B22F 1/02; B22F 3/02
[52] U.S. Cl. ........................................ 419/20; 419/19; 419/23; 419/34; 419/35; 419/64; 419/69
[58] Field of Search ................... 75/247, 228; 428/546; 419/35, 69, 19, 20, 25, 34, 35, 64, 69

[56] References Cited

U.S. PATENT DOCUMENTS

| | | | |
|---|---|---|---|
| 4,158,719 | 6/1979 | Frantz | 428/567 |
| 4,299,629 | 11/1981 | Haack | 75/251 |
| 4,594,217 | 6/1986 | Samal | 419/3 |
| 4,604,259 | 8/1986 | Whitman | 75/247 |
| 4,752,334 | 6/1988 | Nadkarni et al. | 428/614 |
| 4,885,214 | 12/1989 | Trenkler et al. | 428/614 |
| 4,894,293 | 1/1990 | Breit | 428/614 |
| 5,152,959 | 10/1992 | Scorey | 419/66 |

Primary Examiner—Donald P. Walsh
Assistant Examiner—Daniel Jenkins
Attorney, Agent, or Firm—Bachman & LaPointe

[57] ABSTRACT

The present invention relates to a copper-molybdenum composite material having utility in electrical applications and the process for forming the composite material. The composite material is characterized by a continuous copper matrix having a plurality of discrete molybdenum particles embedded therein. The molybdenum particles have an aspect ratio in the range of from about 1:1 to about 4:1 so as to create a thermal path through the matrix from a first side of the composite material to a second side of the composite material. The resulting composite material exhibits improved through-thickness thermal conductivity as a result of the molybdenum particles being within the aforementioned range. The process for forming the composite material includes the steps of blending the molybdenum in powder form with powdered cuprous oxide, heating the blended powdered material to form copper-coated molybdenum particles, blending the copper-coated molybdenum particles with powdered copper and then roll compacting the blended materials to form the composite material. For certain compositions, i.e., those where the molybdenum content is greater than 80 wt. %, the second blending step may be omitted.

10 Claims, 3 Drawing Sheets

MOLYBDENUM PARTICLES IN A COPPER MATRIX (250x)

UN-COATED MOLYBDENUM PARTICLES
X 100

COPPER COATED MOLYBDENUM PARTICLES
X 100

MOLYBDENUM PARTICLES IN A COPPER MATRIX (250x)

COPPER-MOLYBDENUM COMPOSITE STRIP

BACKGROUND OF THE INVENTION

The present invention relates to a composite material having utility in electrical and electronic applications and to a process of forming said composite material.

Electronic packaging demands heat dissipating materials that can provide both good thermal conductivity and low thermal expansion. A low thermal expansion, matching that of semi-conductor and ceramic elements, is needed to avoid harmful stresses during thermal cycling of the electronic package.

Heat dissipating elements are frequently fabricated from strip material because of the required geometry of the element. A flat wafer, shallow tub, or lead frame geometry are common examples. It is important in many of these applications that the through-thickness thermal conductivity be maximized, while the in-plane thermal conductivity is of less significance.

Through-thickness conductivity is a function of the morphology of the low thermal conductivity phase of the composite. In particular, the aspect ratio of the low conductivity phase determines the thermal path length through the high conductivity matrix component from one side of the strip material to the other. As used herein, the term "aspect ratio" means the ratio of the mean in-plane dimension to the through-thickness dimension. It is thus desirable for the low conductivity phase material to have a low aspect ratio.

The processing of the composite strip is significant from the standpoint of maintaining a low conductivity phase with a low aspect ratio in the composite material. Most strip materials are rolled to a desired final thickness. In the case of materials having a deformable low conductivity phase material, rolling will increase the aspect ratio of this phase material. It is therefore desirable that the composite strip material be fabricated with the least amount of rolling.

Roll compaction processes are quite attractive in that they allow near net shape strip fabrication. The initial green strip thickness may be selected so that processing to full density also produces the required finished thickness, preferably without any additional rolling. The roll compaction process is particularly advantageous in forming composite strip where through-thickness thermal conductivity is to be optimized by providing a microstructure in which adjacent low thermal conductivity particles are not in contact.

Another problem which must be dealt with during processing is the closeness of the low conductivity phase particles. Close particles lead to high thermal resistance regions and may result in poor mechanical bonding to the matrix which has a deleterious effect on thermal expansion. To avoid these problems, individual low conductivity particles have been coated with the matrix material prior to the blending portion of the roll compaction process.

U.S. Pat. No. 4,894,293 to Breit et al. illustrates a process for forming a composite material in which the low expansion phase material is coated with the matrix material. In this process, discrete particles of a ferrous alloy are coated with a copper material. Coating of the ferrous alloy particles is effected by electroplating, electroless copper plating or cutting short lengths of a copper-clad fine wire of the ferrous alloy material. The coated particles are then pressed together and heated to diffusion bond the copper coatings. In this process, the heating step must be strictly regulated with respect to temperature and duration so that the copper coatings are diffusion bonded to each other while diffusion of the ferrous components into the copper material is avoided.

The prior art methods for forming a coating on the low thermal conductivity materials suffer from disadvantages such as: (1) difficulty in obtaining a uniform coating; (2) entrapment of impurities; (3) formation of particle agglomerates; and (4) disposal of waste chemicals.

Accordingly, it is an object of the present invention to provide an improved composite material for use in electrical and electronic applications.

It is a further object of the present invention to provide a composite material as above having improved thermal conductivity properties.

It is yet a further object of the present invention to provide a novel process for forming the composite material of the present invention.

These and other objects and advantages will be described in the following description.

SUMMARY OF THE INVENTION

A composite material in accordance with the present invention comprises a continuous matrix of a first metal material and a plurality of discrete elements of a low expansion phase material secured by the matrix material. The discrete elements have an aspect ratio in the range of from about 1:1 to about 4:1 so as to create a thermal path through the matrix from a first side of the composite material to a second opposed side of the composite material.

In an embodiment of the present invention, the continuous matrix material is copper and the low expansion phase material is molybdenum. The copper is present in an amount from about 5 wt. % to about 50 wt. %, preferably from about 10 wt. % to about 25 wt. %; while the molybdenum content is from about 50 wt. % to about 95 wt. %, preferably from about 75 wt. % to about 90 wt. %.

The composite material is formed by blending the low expansion phase material, e.g., molybdenum, in powder form with an oxide of the matrix component, e.g., cuprous oxide, in powder form. The blended powders are then heated in a reducing atmosphere so as to form a coating of the matrix material about the individual particles of the low expansion phase material. The resulting cake is then ground so as to form discrete particles of the low expansion phase material coated with the matrix material. These particles are then blended with particles of the matrix component in powder form and roll compacted to form the composite material, preferably in strip form.

Other details about the composite material and process of the present invention are set out in the following detailed description.

DETAILED DESCRIPTION

In accordance with this invention, a composite material in strip form having improved thermal conductivity is formed by roll compaction of powders. The composite material includes a continuous matrix of a first metal material and a plurality of discrete elements of a low expansion phase metal material embedded therein. The discrete elements or particles of the low expansion phase material have an aspect ratio in the range of from about 1:1 to about 4:1, preferably from about 1:1 to about 2:2, so as to create a thermal path length through the matrix from one side of the composite material to a second side of the composite material opposed to the first side.

It has been found that a particularly useful composite material is one having a continuous matrix of copper and a low expansion phase of molybdenum particles. Copper may be present in the composite in an amount from about 5 wt. % to about 50 wt. %, preferably from about 10 wt. % to about 25 wt. %; while molybdenum is present in the composite in an amount from about 50 wt. % to about 95 wt. %, preferably from about 75 wt. % to about 90 wt. %. Of course, the molybdenum is present in the form of discrete particles having the aforesaid aspect ratios.

Figure 1:
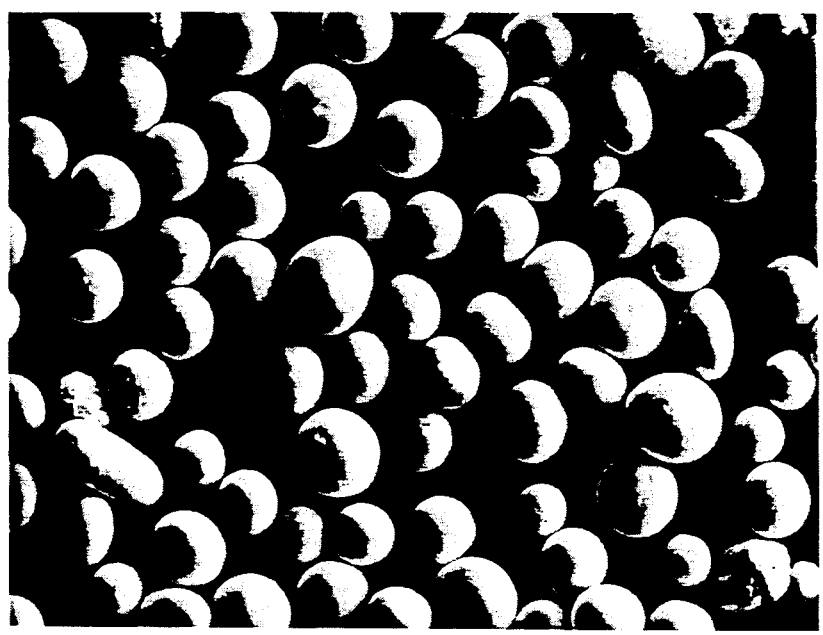
FIG. 1 is a photograph of uncoated molybdenum particles at a magnification of 100×.

The composite strip material is formed by first blending the low expansion phase material in powder form, such as the uncoated molybdenum particles shown in FIG. 1, with an oxide of the matrix material. When the low expansion phase material is molybdenum and the matrix material is copper, a high-purity molybdenum powder having a particle size in the range Of from about $20\mu$ to about $200\mu$, preferably from about $50\mu$ to about $150\mu$, is blended with cuprous oxide powder having a particle size in the range of from about $1\mu$ to about $10\mu$. The two powders are blended in a ratio of molybdenum to cuprous oxide in the range of from about 0.8:1 to about 19:1, preferably from about 1.7:1 to about 8:1. A wetting agent, such as pine oil or glycerine, is added to the mixture in an amount from about 0.2 wt. % to about 5.0 wt. %. The wetting agent causes the oxide particles to adhere to the surface of the low expansion particles. Pine oil and glycerine have been found to be particularly useful for this purpose.

Figure 2:
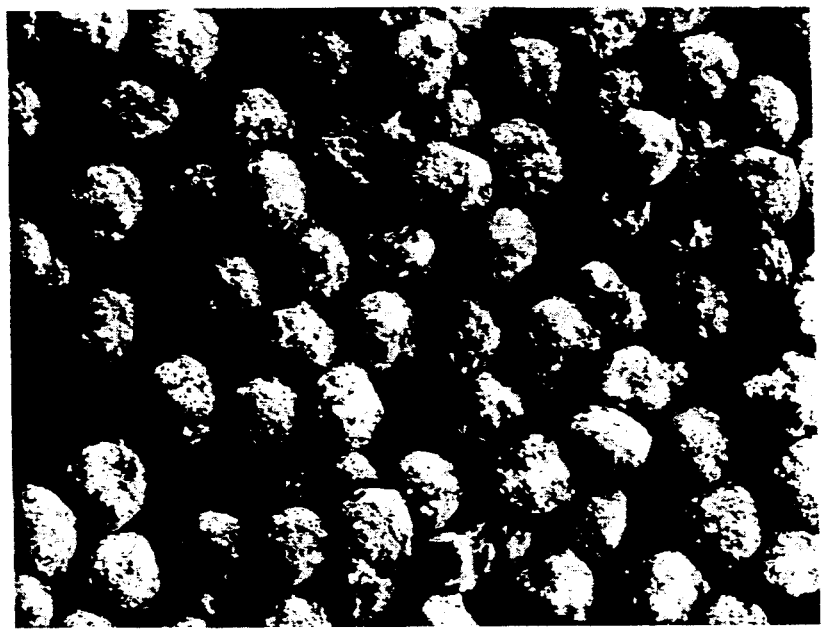
FIG. 2 is a photograph of copper coated molybdenum particles at a magnification of 100×.

The low expansion phase material in powdered form and the matrix oxide material in powdered form are then intimately blended using any suitable blending device known in the art. Thereafter, the blended powder is heated in a reducing atmosphere. For the aforementioned molybdenum-cuprous oxide blend, the blended powder can be heated in a hydrogen-containing atmosphere at a temperature from about 650° C. to about 980° C., preferably from about 780° C. to about 900° C., for a time period in the range of from about 5 minutes to about 2 hours, preferably from about 30 minutes to about 1 hour. Thereafter, the resulting cake of low expansion phase material with the reduced oxide material may be ground into a powder using any suitable means know in the art such as a hammer mill and passed through a screen. The resulting powder should have a particle size in the range of from about $20\mu$ to about $200\mu$, preferably from about $50\mu$ to about $150\mu$. If agglomerations are present, the particle size should be less than $200\mu$. As shown in FIG. 2, the powdered particles substantially comprise discrete particles of the low expansion phase material coated with the reduced matrix material. The advantages of the foregoing coating technique include: (1) the absence of any solutions such as plating baths; (2) the absence of any disposal problems; (3) no entrapped plating bath or other unwanted chemicals in the particles; and (4) the production of a clean powder with substantially no contaminants. Other significant advantages include the ability to individually coat the particles and to maintain a majority of the particles as discrete particles.

The coated particles in powdered form may be blended with a quantity of the matrix material sufficient to yield a composite having a desired composition. To form the aforementioned molybdenum-copper composite, the copper-coated molybdenum particles may be blended with elemental copper in a ratio of coated particles to copper in the range of from about 1.5:1 to about 4:1. The elemental copper is added in powder form having a particle size in the range of from about $1\mu$ to about $40\mu$. The resulting composite will have the aforementioned composition and will be fully dense in a finished state.

When the final composite has a molybdenum content in the range of from about 80 wt. % to about 95 wt. % and a copper content in the range of from about 5 wt. % to about 20 wt. %, this second blending step can be omitted since the desired copper content can be obtained from using solely the copper in the cuprous oxide in the initial blending.

The blended particles are then compacted into a strip material having a thickness about 30% to about 60% higher than the desired finish thickness for the composite in order to fully control the aspect ratio of the low expansion phase particles so as to achieve the desired through-thickness conductivity. The powder may be compacted using any suitable technique in the art. For example, the powders may be roll compacted into strip form by passing the blended powders through rollers at a compacting pressure in the range of from about 20 tons/in$^2$ to about 65 tons/in$^2$.

Figure 3:
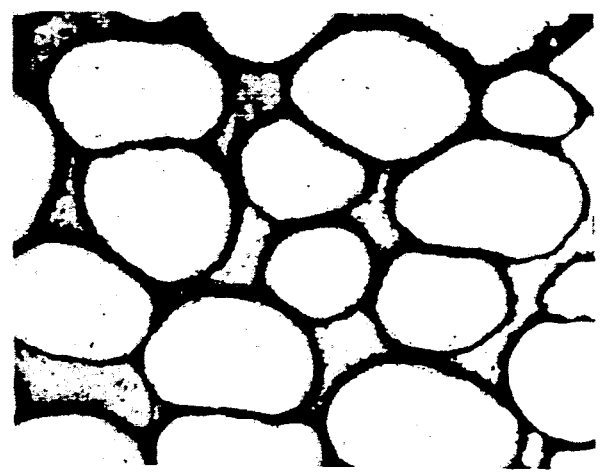
FIG. 3 is a photomicrograph of a copper-molybdenum composite microstructure formed in accordance with the present invention at a magnification of 250×.

The green compact is then heated in a reducing atmosphere such as a standard hydrogen-containing reducing atmosphere with a dew point in the range of from about $-30°$ F. to about $+20°$ F. so that any copper oxides are reduced for a time period in the range of from about 5 minutes to about 60 minutes in a furnace at a temperature of from about 650° C. to about 990° C., preferably from about 780° C. to about 900° C. The heated material is then rolled to a desired final thickness, preferably in a single step. FIG. 3 illustrates a typical copper-molybdenum composite microstructure obtained using the teachings of the present invention.

It has been found that a composite material formed in accordance with the present invention provides improved through-thickness thermal conductivity as compared to a similar composite formed from the same elemental components. Additionally, composites formed in accordance with the present invention may have thermal expansion coefficients in the range of about $6.5 \times 10^{-6/°}$ C. to about $9.5 \times 10^{-6/°}$ C. This composite material very useful since these coefficients match the coefficients of dielectric substrates used in semiconductor packaging.

The following examples demonstrate the improvements which can be obtained.

EXAMPLE I

A mixture of 73 wt. % molybdenum powder having an oxygen content of 0.84% and a particle size in the range of $100\mu$ to $200\mu$ and 27 wt. % cuprous oxide powder having a particle size in the range of 1μ to 10μ with a 0.2 wt. % pine oil addition was intimately blended in a twin shell blender. The blended powders were heated in a hydrogen-containing atmosphere at about 980° C. for 45 minutes. The resulting cake of reduced copper and molybdenum was ground to −100 mesh.

The resulting powder was blended with a sufficient amount of elemental copper powder having a particle size in the range of 1μ to 10μ to yield a composition with 38 wt. % molybdenum and the balance essentially copper. A 0.050" thick green compact was made from this powder. The compact was heated in a hydrogen-containing atmosphere for 30 minutes in a furnace at about 990° C. The heated material was then rolled to a thickness of 0.032" and its thermal expansion coefficient was measured (See Table 1).

A second sample of the same powder composition was compacted to a green gauge of 0.083", similarly heated, and rolled to a gauge of 0.054". The through-thickness thermal conductivity of this sample was then measured (See Table 1).

EXAMPLE II

For comparison purposes a mixture of 38 wt. % molybdenum powder having an oxygen content of 0.84% and a particle size in the range of 100μ to about 200μ and 62 wt. % copper powder having a particle size in the range of about 1μ to about 10μ was blended to a green gauge of 0.050". The compact was heated in a hydrogen-containing atmosphere for 30 minutes in a furnace at 990° C. The material was then rolled to a thickness of 0.032" and its coefficient of thermal expansion was measured (See Table 1). A second sample of the same powder was compacted to a gauge of 0.100", similarly heated, and rolled to a gauge of 0.055". The through-thickness conductivity was then measured (See Table 1).

It can be seen from a comparison of the results of these two examples that the composite material formed in accordance with the present invention exhibited a higher thermal conductivity then the composite formed from the elemental components. Additionally, the composite formed in accordance with the present invention had a thermal expansion in a temperature range of 30° C.-150° C. substantially similar to that of the composite formed from the elemental materials.

EXAMPLE III

A second composite strip was formed in accordance with the present invention by blending 78 wt. % molybdenum powder having an oxygen content of 0.84% and a particle size in the range of 100μ to 200μ and 22 wt. % cuprous oxide powder having a particle size in the range of 1μ to 10μ with a 0.2 wt. % pine oil addition. The blended powder was heated in a hydrogen-containing atmosphere at about 980° C. The resulting cake of reduced copper and molybdenum containing 80 wt. % molybdenum, balance copper was ground to −100 mesh. A 0.102" thick green compact was made from this powder. The green compact was heated in a hydrogen-containing atmosphere for 30 minutes in a furnace at a temperature of about 980° C. The material was then rolled to a thickness of 0.050" and its through-thickness thermal conductivity was measured (See Table 1).

A second sample of a similar powder was compacted to a green gauge of 0.042", similarly heated, rolled to a gauge of 0.030" and its thermal expansion coefficient was measured (See Table 1).

EXAMPLE IV

For comparison purposes, a blend of 80 wt. % molybdenum powder having an oxygen content of 0.84% and a particle size in the range of 100μ to 200μ and 20 wt. % copper powder having a particle size in the range of about 1μ to about 10μ was blended and compacted to a green gauge of 0.098". The compact was heated in a hydrogen containing atmosphere for 30 minutes at a temperature of about 980° C. The material was then rolled to a thickness of 0.050" and its through-thickness thermal conductivity was measured (See Table 1).

A second sample of the same blended composition was compacted to a gauge of 0.042", similarly heated, rolled to a gauge of 0.030" and its thermal coefficient was measured (See Table 1).

It can be seen from a comparison of the results for examples 3 and 4 in Table 1, that the composite material formed in accordance with the present invention had a higher thermal conductivity then the composite material formed from the elemental components.

TABLE 1

| Example | Wt. % Mo | Thermal Expansion, 30–150° C. ($\times 10^{-6}$/°C.) | Thermal Conductivity (W/mk) |
|---|---|---|---|
| 1 | 38 | 12.2 | 250 |
| 2 | 38 | 12.3 | 208 |
| 3 | 80 | 6.9 | 129 |
| 4 | 80 | 7.8 | 115 |

It can be seen from the foregoing examples that a copper-molybdenum composite strip formed in accordance with the present invention has improved through-thickness thermal conductivity. This improvement is achieved while eliminating the disadvantages of prior art methods for forming similar composite materials to be used in electrical applications.

To further demonstrate the present invention, the following example was performed.

EXAMPLE V

A mixture of 227 grams of molybdenum powder, 66.6 grams of cuprous oxide powder and 8 milliliters (2.7 wt. %) of pine oil were blended together. The molybdenum powder had an oxygen content of 0.08% and a typical particle size of 80 microns. The cuprous oxide particle size was 3 to 5 microns. The blended powders were heated in a hydrogen-containing atmosphere at 904° C. for 30 minutes. The resultant cake was ground and passed through a 50-mesh screen (297-micron opening). An addition of 14.1 grams of copper powder (10 to 40 micron particle size) was added to produce a powder blend comprising about 25 weight percent copper. This powder was in turn blended with 2 milliliters of a water/glycerine mixture (20 percent by volume glycerine) and roll compacted into strip. The compacting load was approximately 140,000 pounds. A green strip 4 inches wide and 0.082 inches thick was obtained. The compact was then sintered in a furnace with a hydrogen-containing atmosphere at 882° C. for 30 minutes. Following this treatment, the strip was rolled to 0.050 inch thickness with two intermediate anneals at 900° C. for 20 minutes. The through-thickness thermal conductivity and the coefficient of thermal expansion of the material was then measured (see Table II).

TABLE II

| Example | Weight Percent Molybdenum | Thermal Expansion 30-150° C. (× 10$^{-6}$/°C.) | Thermal Conductivity W/mK |
| --- | --- | --- | --- |
| 5 | 75 | 7.8 | 181 |

As can be seen from this data, excellent through-thickness thermal conductivity and thermal expansion coefficient properties were obtained.

While the instant application discusses cuprous oxide as a preferred source of copper, it should be recognized that cupric oxide could be used as well.

It is apparent that there has been provided in accordance with this invention a copper-molybdenum composite strip which fully satisfies the objects, means and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A process for forming a composite strip material having a matrix component and a low conductivity phase material component, said process comprising:
   blending a low expansion phase material in powder form with an oxide of a desired matrix component in powder form;
   heating said blended low expansion phase material and matrix oxide in a reducing atmosphere so as to form a coating of said matrix component about individual particles of said low expansion phase material;
   blending said coated particles in powdered form with said matrix component in powdered form; and
   rolling compacting said powdered coated particles and said powdered matrix component to form said composite strip material such that said low expansion material has an aspect ratio in the range from about 1:1 to about 4:1 so as to create a thermal path length through the matrix from a first side of said composite strip material to a second side of said composite strip material.

2. The process of claim 1 wherein said first blending step comprises blending molybdenum having a particle size in the range of from about 20μ to about 200μ with cuprous oxide powder having a particle size in the range of from about 1μ to about 10μ in a ratio of molybdenum powder to cuprous oxide powder in the range of from about 0.8:1 to about 19:1.

3. The process of claim 2 wherein said first blending step comprises blending from about 0.2 wt. % to about 5.0 wt. % of a wetting agent for causing said oxide particles to adhere to the surfaces of said molybdenum particles.

4. The process of claim 2 wherein said first blending step comprises blending from about 0.2 wt. % to about 5.0 wt. % of pine oil or glycerine for causing said oxide particles to adhere to the surfaces of said molybdenum particles.

5. The process of claim 2 wherein said heating step comprises heating said molybdenum and cuprous oxide particles at a temperature in the range of from about 650° C. to about 980° C. for a time period in the range of from about 5 minutes to about 2 hours in a hydrogen-containing atmosphere.

6. The process of claim 2 further comprising:
   grinding said coated particles to a size in the range of from about 20μ to about 200μ prior to said second blending step.

7. The process of claim 2 wherein said second blending step comprises blending copper coated molybdenum particles with elemental copper powder having a grain size int he range of from about 1μ to about 40μ in a ratio of coated particles to copper in the range of from about 1.5:1 to about 4:1.

8. The process of claim 7 wherein said roll compacting step comprises passing said blended material through a pair of rollers.

9. A process for forming a composite strip material having a matrix component and a low conductivity phase material component, said process comprising:
   blending a low expansion phase material in powder form with an oxide of a desired matrix component in powder form;
   heating said blended low expansion phase material and matrix oxide in a reducing atmosphere so as to form a coating of said matrix component about individual particles of said low expansion phase material; and
   rolling compacting said coated particles in powder form to form said composite strip material such that said low expansion material has an aspect ratio in the range from about 1:1 to about 4:1 so as to create a thermal path length through the matrix from a first side of said composite strip material to a second side of said composite strip material.

10. The process of claim 9 wherein said blending step comprises blending from about 80 wt. % to about 95 wt. % molybdenum in powder form with from about 5 wt. % to about 20 wt. % cuprous oxide in powder form.

* * * * *